United States Patent
Wang et al.

(10) Patent No.: US 10,969,424 B2
(45) Date of Patent: Apr. 6, 2021

(54) CHIP AND PERFORMANCE MONITORING METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hao Wang, Hsinchu (TW); Pei-Ju Lin, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 196 days.

(21) Appl. No.: 16/275,297

(22) Filed: Feb. 13, 2019

(65) Prior Publication Data
US 2020/0132752 A1 Apr. 30, 2020

(30) Foreign Application Priority Data
Oct. 25, 2018 (TW) ................................ 107137833

(51) Int. Cl.
*G01R 31/28* (2006.01)
*H03K 3/03* (2006.01)
(52) U.S. Cl.
CPC ....... *G01R 31/2856* (2013.01); *H03K 3/0315* (2013.01)

(58) Field of Classification Search
CPC ............ G01R 31/2856; G01R 31/3173; G01R 31/3004; G01R 31/2884; H03K 3/0315
See application file for complete search history.

(56) References Cited

U.S. PATENT DOCUMENTS

| 8,593,171 B2 * | 11/2013 | Kosonocky | ............ G01R 31/40 |
| | | | 324/764.01 |
| 2015/0109060 A1 * | 4/2015 | Huang | ...................... H03L 1/00 |
| | | | 331/16 |
| 2018/0259581 A1 * | 9/2018 | Li | ........................... H01L 22/34 |
| 2020/0287006 A1 * | 9/2020 | Sharma | ............. H01L 29/78696 |

FOREIGN PATENT DOCUMENTS

TW I534445 B 5/2016

* cited by examiner

*Primary Examiner* — Christopher P McAndrew
*Assistant Examiner* — Zannatul Ferdous
(74) *Attorney, Agent, or Firm* — CKC & Partners Co., LLC

(57) ABSTRACT

A chip includes at least one oscillator circuitry and a controller circuitry. The at least one oscillator circuitry is disposed at different locations of the chip, and respectively generates a plurality of oscillating signals. The controller circuitry transmits the oscillating signals to an external system, in order to determine a performance of the chip based on the oscillating signals. Each of the at least one oscillator circuitry includes a first oscillator circuit and a second oscillator circuit. The first oscillator circuit senses a variation of a semiconductor device in the chip, in order to generate a first oscillating signal of the oscillating signals. The second oscillator circuit senses a variation of a parasitic component in the chip, in order to generate a second oscillating signal of the oscillating signals.

8 Claims, 4 Drawing Sheets

CHIP AND PERFORMANCE MONITORING METHOD

RELATED APPLICATIONS

This application claims priority to Taiwan Application Serial Number 107137833, filed Oct. 25, 2018, which is herein incorporated by reference.

BACKGROUND

Technical Field

The present disclosure relates to a chip and a performance monitoring method. More particularly, the present disclosure relates to a chip with a built-in testing circuit and a performance monitoring method.

Description of Related Art

Integrated circuits are widely used in electronic devices, and the performance of integrated circuits usually determines the overall performance of electronic devices. In some related technologies, the performance of an integrated circuit can be determined by utilizing an estimated critical path. However, due to the variations introduced by actual operating conditions or process, the real critical path cannot be accurately determined.

SUMMARY

Some aspects of the present disclosure are to provide a chip that includes at least one oscillator circuitry and a controller circuitry. The at least one oscillator circuitry is disposed at different locations of the chip, and is configured to respectively generate a plurality of oscillating signals. The controller circuitry is coupled to the at least one oscillator circuitry, and is configured to receive the oscillating signals and transmit the oscillating signals to an external system in order to determine a performance of the chip based on the oscillating signals. Each of the at least one oscillator circuitry includes a first oscillator circuit and a second oscillator circuit. The first oscillator circuit is configured to sense a variation of a semiconductor device in the chip in order to generate a first oscillating signal of the oscillating signals. The second oscillator circuit is configured to sense a variation of a parasitic component in the chip in order to generate a second oscillating signal of the oscillating signals.

Some other aspects of the present disclosure are to provide a performance monitoring method that includes the following operations: respectively generating a plurality of oscillating signals by at least one oscillator circuitry in a chip, wherein the least one oscillator circuitry is disposed at different locations of the chip; and transmitting the oscillating signals to an external system in order to determine a performance of the chip based on the oscillating signals. Each of the at least one oscillator circuitry includes a first oscillator circuit and a second oscillator circuit, and generating the oscillating signals includes: sensing a variation of a semiconductor device in the chip by the first oscillator circuit in order to generate a first oscillating signal of the oscillating signals; and sensing a variation of a parasitic component in the chip by the second oscillator circuit in order to generate a second oscillating signal of the oscillating signals.

As described above, the chip and the performance monitoring method according to the present disclosure can determine the performance based on the frequencies of the plurality of oscillating signals generated in the chip. The plurality of oscillating signals are configured to reflect multiple variation factors (device, resistance, voltage, etc.) to more accurately estimate the performance of the chip.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

All terms used herein have their ordinary meanings. The above terms are defined in the commonly used dictionaries, and any examples of the use of the term discussed herein included in the description of the present specification are merely for illustrative purposes, and are not intended to limit the scope and meaning of the present disclosure. Similarly, the present disclosure is not limited to the various embodiments described in this specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure. It will be understood that, as used herein, the phrase "and/or" includes any and all combinations of one or more of the associated listed items.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
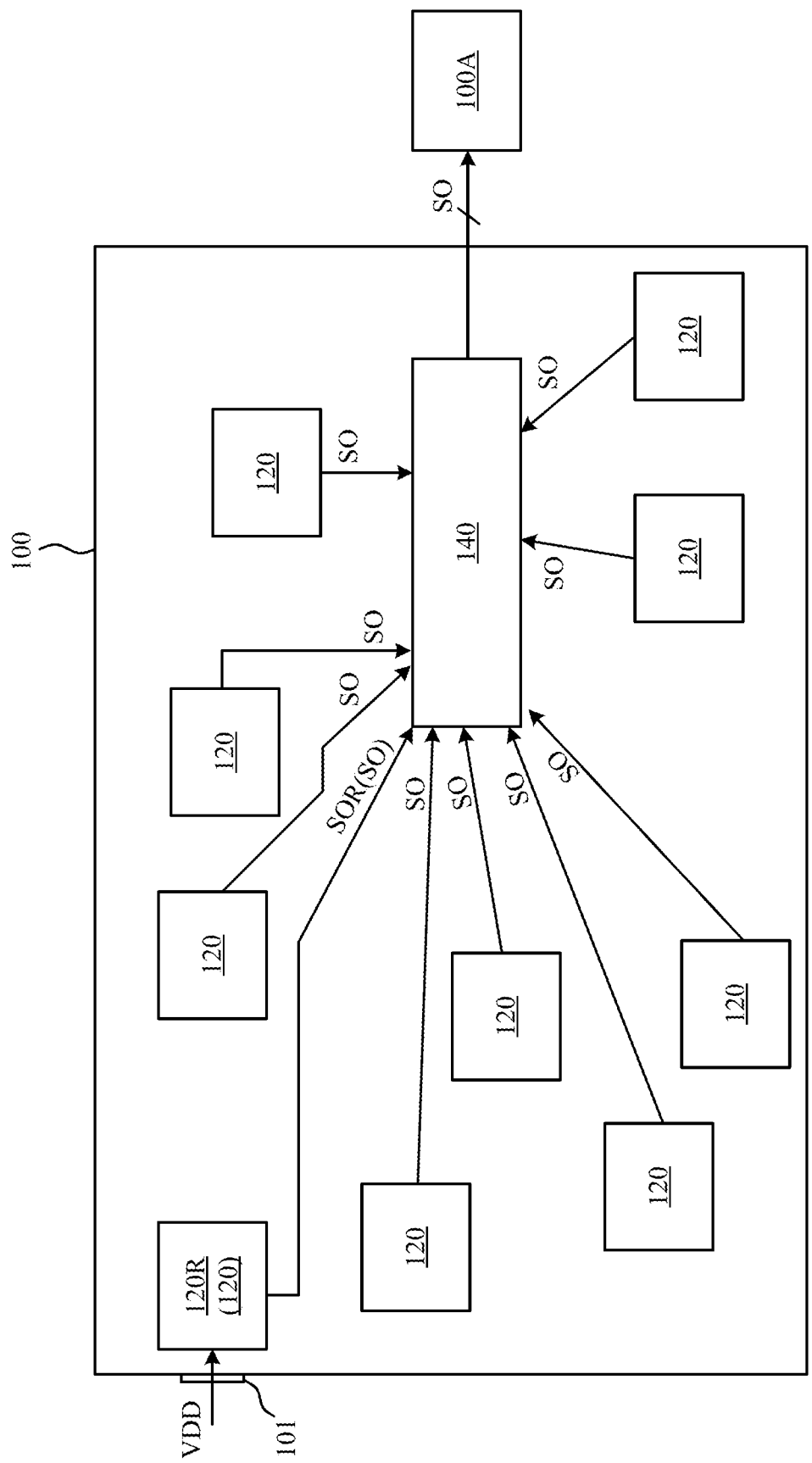
FIG. 1 is a schematic diagram of a chip according to some embodiments of the present disclosure.

Reference is now made to FIG. 1. FIG. 1 is a schematic diagram of a chip 100 according to some embodiments of the present disclosure. In some embodiments, the chip 100 may have one or more integrated circuits.

The chip 100 includes a plurality of oscillator circuitries 120 and a controller circuitry 140. The oscillator circuitries 120 are disposed at different locations of the chip 100. Each of the oscillator circuitries 120 generates oscillating signals SO having different frequencies based on process variations, voltage variations, temperature variations corresponding to different locations of the chip 100. The controller circuitry 140 is coupled to the oscillator circuitries 120 to receive the plurality of oscillating signals SO.

A number of the oscillator circuitries 120 is given for illustrative purposes, and the present disclosure is not limited thereto. In different embodiments, the chip 100 may include any number (such as, one or more) of oscillator circuitries 120.

In some embodiments, each of the oscillating signals SO shown in FIG. 1 may be a combination (or a collection) of oscillating signals (such as signals SO1, SO2, and SO3 shown in FIG. 2 that are described below).

In some embodiments, the controller circuitry 140 may determine a performance of the chip 100 based on the oscillating signals SO. Alternatively, in some embodiments, the controller circuitry 140 may transmit the oscillating signals SO to an external system 100A (such as, a test station, a computer, etc.) according to an instruction sent by the external system 100A. In this manner, the external system 100A can perform calculation based on the plurality of oscillating signals SO to determine the performance of the chip 100.

In some embodiments, the controller circuitry 140 may be implemented by a processing circuit and/or a signal transmission interface circuit, in order to determine the performance of the chip 100 and/or to transmit the oscillating signals SO to the external system 100A.

In some embodiments, an oscillator circuitry 120R is disposed adjacent to an input/output (I/O) terminal 101 of the chip 100 for receiving a supply voltage VDD. The supply voltage VDD is used for driving the chip 100. In some embodiments, since the oscillator circuitry 120R is disposed at a known predetermined location (such as, a location adjacent to the I/O terminal 101), an oscillating signal SOR generated by the oscillator circuitry 120R may be used as a reference signal. The location adjacent to the I/O terminal 101 is given as an example of the above known predetermined location, but the present disclosure is not limited thereto.

In addition, for ease of understanding, the supply voltage VDD is only depicted as being transmitted to the oscillator circuitry 120R in FIG. 1. However, in some embodiments, the supply voltage VDD is transmitted to all the oscillator circuitries 120 and/or other circuits (not shown in the figure) in the chip 100, in order to drive the circuit components.

Figure 2:
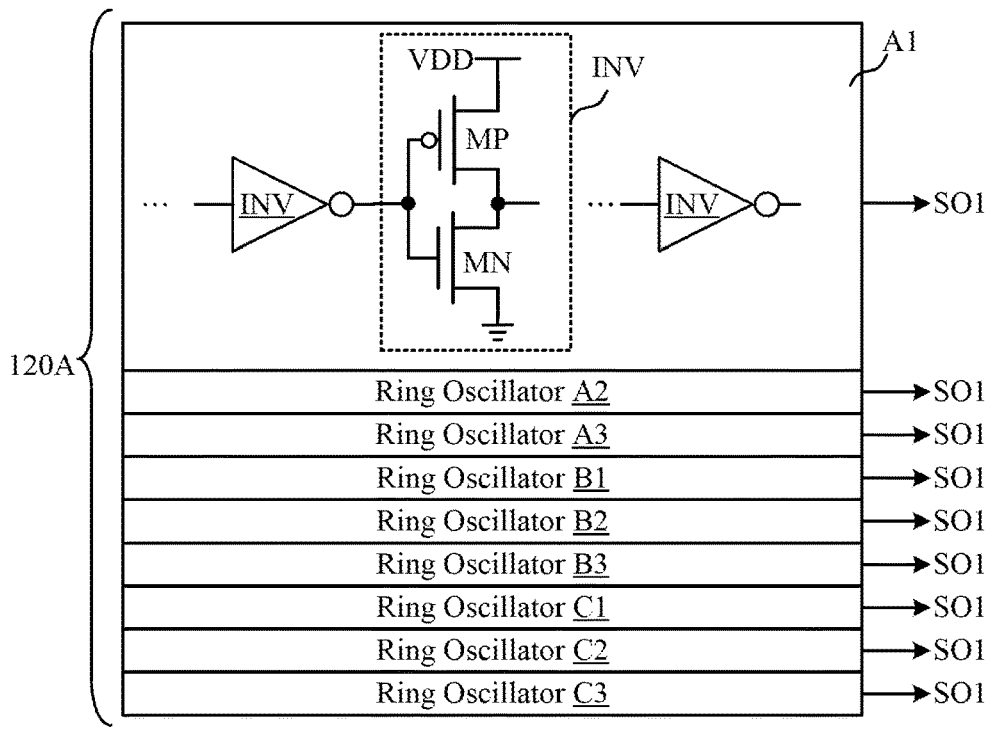
FIG. 2 is a schematic diagram of the oscillator circuitry in FIG. 1 according to some embodiments of the present disclosure.
Figure 2:
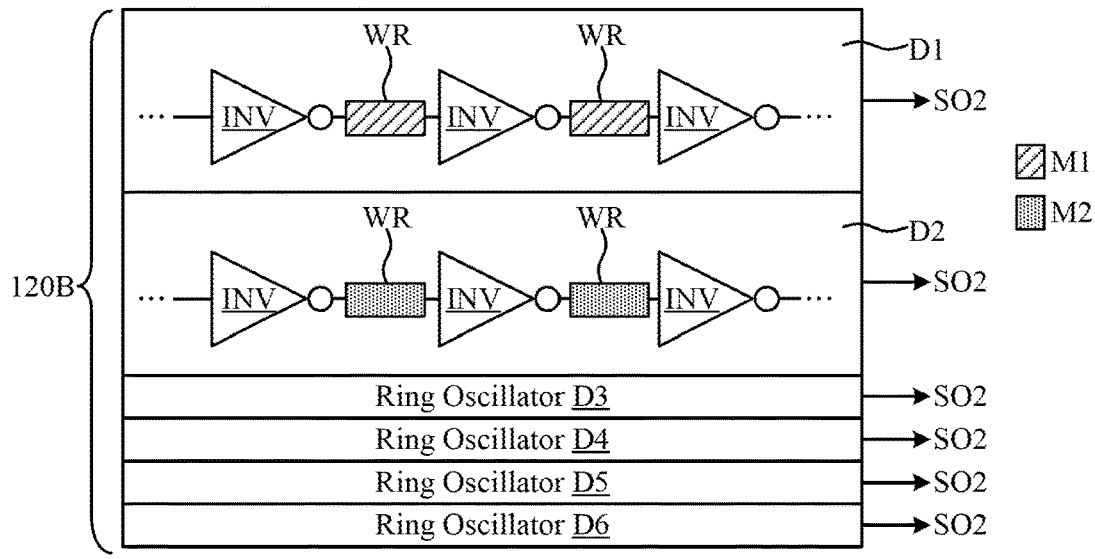
Figure 2:
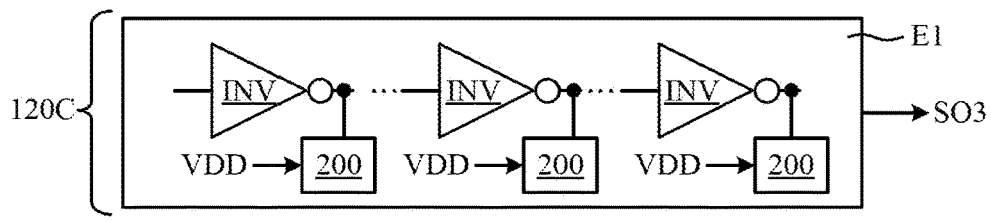

Reference is now made to FIG. 2. FIG. 2 is a schematic diagram of the oscillator circuitry 120 in FIG. 1 according to some embodiments of the present disclosure. In some embodiments, the oscillator circuitry 120 includes oscillator circuits 120A and 120B.

In some embodiments, the oscillator circuit 120A is disposed to sense a variation of at least one semiconductor device in the chip 100. For example, the oscillator circuit 120A includes ring oscillators A1-A3, ring oscillators B1-B3, and ring oscillators C1-C3. In some embodiments, each of the ring oscillators A1-A3, the ring oscillators B1 to B3, and the ring oscillators C1-C3 may be formed by inverters INV coupled in series, and each of the inverters INV may be implemented by a P-type transistor MP and an N-type transistor MN coupled in series. In this example, threshold voltages of the P-type transistors MP in the ring oscillators A1-A3 are different from one another. For example, the P-type transistor MP in the ring oscillator A1 is configured to have a low threshold voltage, the P-type transistor MP in the ring oscillator A2 is configured to have a standard threshold voltage, and the P-type transistor MP in the ring oscillator A3 is configured to have a high threshold voltage.

Similarly, in this example, threshold voltages of the N-type transistors MN in the ring oscillators B1 to B3 are different from one another. For example, the N-type transistor MN in the ring oscillator B1 is configured to have a low threshold voltage, the N-type transistor MN in the ring oscillator B2 is configured to have a standard threshold voltage, and the N-type transistor MN in the ring oscillator B3 is configured to have a high threshold voltage.

Additionally, in this example, threshold voltages of the P-type transistors MP and the N-type transistors MN in the ring oscillators C1 to C3 are different from one another. For example, both the P-type transistor MP and the N-type transistor in the ring oscillator C1 are configured to have low threshold voltages, both the P-type transistor MP and the N-type transistor MN in the ring oscillator C2 are configured to have standard threshold voltages, and both the P-type transistor MP and the N-type transistor MN in the ring oscillator C3 are configured to have high threshold voltages.

With this configuration, the oscillator circuit 120A is able to be more sensitive to device variations. The oscillator circuit 120A can generate oscillating signals SO1 based on transistors having different threshold voltages. As a result, a frequency of the plurality of oscillating signals SO1 can be used to reflect the influence of device variations on the chip 100.

The above configuration of the oscillator circuit 120A is given for illustrative purpose, and the present disclosure is not limited thereto. Various configurations that can be used for detecting device variations are within the contemplated scope of the present disclosure.

In some embodiments, the oscillator circuit 120B is disposed to detect a variation of at least one parasitic component in the chip 100. In some embodiments, the at least one parasitic component may include a parasitic capacitance and/or a parasitic resistance caused by real wire(s). For example, the oscillator circuit 120B includes ring oscillators D1 to D6. Interconnects WR of the ring oscillators D1 to D6 (for example, interconnects between a plurality of inverters INV connected in series) are implemented with different metal layers. For example, the interconnect WR of the ring oscillator D1 is implemented with a first metal layer M1. The interconnect WR of the ring oscillator D2 is implemented with a second metal layer M2. By analogy, the oscillator circuit 120B is able to more sensitive to variations of parasitic components (such as a parasitic resistance variation or a parasitic capacitance variation caused by metal wire(s)). The oscillator circuit 120B can generate oscillating signals SO2 based on different metal layers. As a result, a frequency of the plurality of oscillating signals SO2 can be used to reflect the influence of parasitic component variations on the chip 100.

The above configuration of the oscillator circuit 120B is given for illustrative purposes, and the present disclosure is not limited thereto. Various configurations that can be used for detecting parasitic component variations are within the contemplated scope of the present disclosure.

In some embodiments, the oscillator circuitry 120 may only employ the oscillator circuits 120A and 120B. In some further embodiments, in order to more accurately determine the performance of the chip 100, the oscillator circuitry 120 may further include an oscillator circuit 120C. The oscillator circuit 120C is configured to detect at least one voltage variation in the chip 100. For example, the oscillator circuit 120C includes a ring oscillator E1. In some embodiments, output terminals of inverters INV coupled in series in the ring oscillator E1 are respectively coupled to voltage controlled components 200. In other words, the voltage controlled component 200 can be considered as a load of the inverter. In this example, the supply voltage VDD can be used to drive multiple inverters INV in the ring oscillator E1, and used to set the voltage controlled components 200. For example, the voltage controlled component 200 may be a voltage controlled capacitor, and its capacitance can be determined based on the received supply voltage VDD. With this configuration, the oscillator circuit 120C can generate an oscillating signal SO3 having different frequencies based on a variation of the received supply voltage VDD. As a result, a frequency of the oscillating signal SO3 can be used to reflect the influence of voltage variations on the chip 100.

The above configuration of the oscillator circuit 120C is given for illustrative purposes, and the present disclosure is not limited thereto. In addition, the above various oscillator circuits are given with an example of using the ring oscillators for illustrative purposes, and various configurations that can be used for detecting voltage variations are within the contemplated scope of the present disclosure.

Moreover, as mentioned above, the oscillating signal SOR output by the oscillator circuitry 120R may be used as the reference signal. For example, since the oscillator circuitry 120R is adjacent to the I/O terminal 101, the received supply voltage VDD has a relatively low variation. Under this condition, the oscillating signal SO3 output by the oscillator circuit 120C in the oscillator circuitry 120R can be considered as the reference signal. In some embodiments, the reference signal can be used to be compared with the oscillating signals SO3 output by the other oscillator circuitries 120, in order to evaluate the influence of voltage variations on the chip 100.

Figure 3:
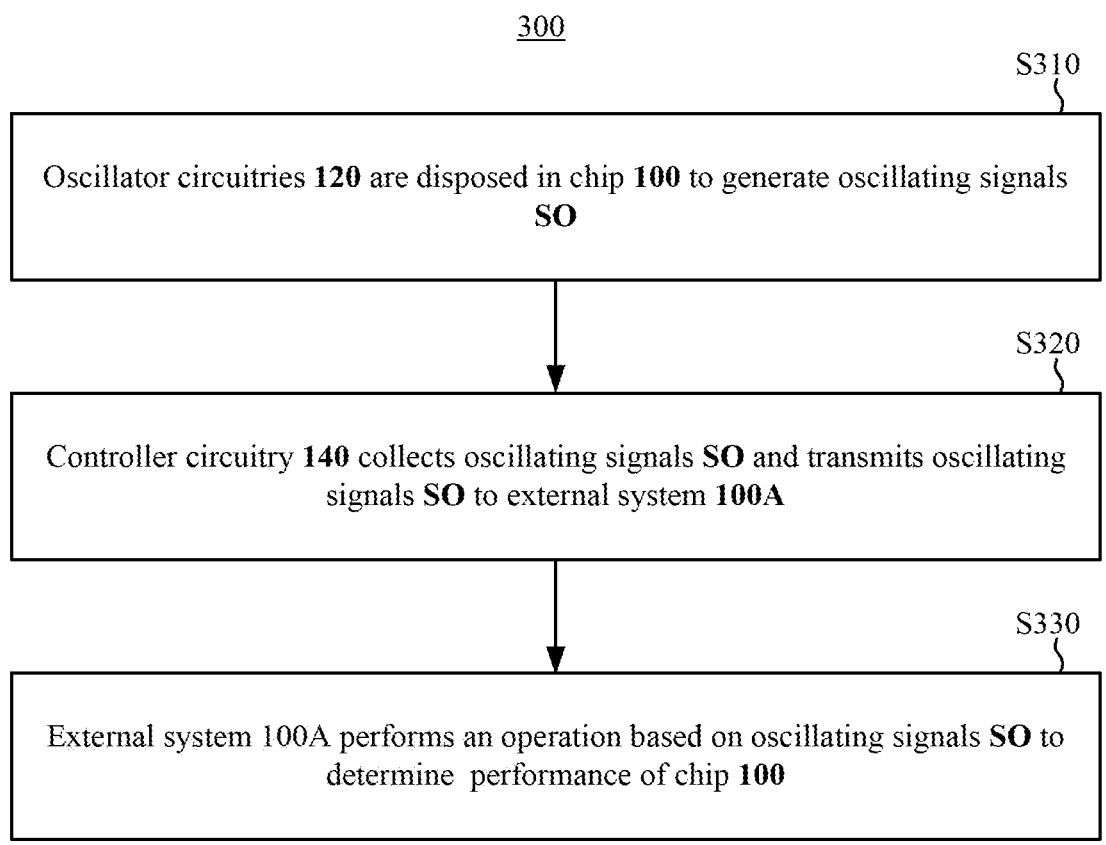
FIG. 3 is a flowchart of a performance monitoring method according to some embodiments of the present disclosure.

Reference is now made to FIG. 3. FIG. 3 is a flowchart of a performance monitoring method 300 according to some embodiments of the present disclosure. In some embodiments, the performance monitoring method 300 can be used to determine a performance of the chip 100 in FIG. 1. For ease of understanding, a description is provided with reference to FIG. 1 to FIG. 2.

In operation S310, the plurality of oscillator circuitries 120 are disposed in the chip 100 to generate the plurality of oscillating signals SO.

For example, the plurality of oscillator circuitries 120 are disposed in the chip 100 as shown in FIG. 1. When the chip 100 is powered up (for example, receiving the supply voltage VDD), the plurality of oscillator circuitries 120 are activated to generate the different oscillating signals SO based on their operating conditions (that is, conditions including process, voltage, and/or temperature, etc.) associated with their respective locations. As shown in FIG. 2, the oscillator circuits 120A, 120B, and 120C in each of the oscillator circuitries 120 respectively generate the plurality of oscillating signals SO1, SO2, and SO3 based on different settings. In other words, each of the oscillating signals SO represents the plurality of oscillating signals SO1, SO2, and SO3 corresponding to different settings.

In operation S320, the controller circuitry 140 collects the plurality of oscillating signals SO and transmits the plurality of oscillating signals SO to the external system 100A.

In operation S330, the external system 100A performs an operation based on the plurality of oscillating signals SO to determine the performance of the chip 100.

For example, as shown in FIG. 1, the external system 100A receives the plurality of oscillating signals SO1 to SO3 through the controller circuitry 140. During the measurement process, the supply voltage VDD starts to decrease from an initial value. In response to the decrease in the supply voltage VDD, the frequencies of the plurality of oscillating signals SO1, SO2, and SO3 generated by each of the oscillator circuitries 120 begin to decrease. When the supply voltage VDD is low enough to cause the chip 100 to fail to operate (or its performance is below a target value), the external system 100A records the frequencies of the plurality of oscillating signals SO1, SO2, and SO3 that are received.

Then, the external system 100A can determine the performance of the chip 100 based on a performance function and the frequencies of the plurality of collected oscillating signals SO1, SO2, and S03. In some embodiments, the performance function can be expressed as follows:

$$T=\text{func}_T(\text{func}_1(K_1 \times f_1), \text{func}_2(K_2 \times f_2), \text{func}_3(K_3 \times f_3))$$

Where T is the performance of the chip 100, $K_1$, $K_2$, and $K_3$ are weight coefficients, $f_1$, $f_2$, and $f_3$ are respectively the frequencies of the oscillating signals SO1, SO2, and S03, $\text{func}_1$ is a sub-function for processing the frequency $f_1$, $\text{func}_2$ is a sub-function for processing the frequency $f_2$, $\text{func}_3$ is a sub-function for processing the frequency $f_3$, and $\text{func}_T$ is the performance function for processing the results of the above sub-functions.

In some embodiments, each of the sub-functions $\text{func}_1$, $\text{func}_2$, and $\text{func}_3$ may be a weighted summation function. In some embodiments, the performance function $\text{func}_T$ may be a weighted summation function. In some embodiments, if the oscillating signal SO3 generated by the oscillator circuitry 120R disposed at the known location is used as the reference signal, an operation of a deviation function can be further added to the sub-function $\text{func}_3$. Under this condition, this reference signal may be regarded as the standard value (or may be regarded as the average value) in the deviation function to estimate the performance T of the chip 100 by further covering the deviations caused by voltage variations at various locations of the chip 100. In some embodiments, the deviation function may be an average magnitude difference function, a standard deviation function, or the like.

In some embodiments, during the initial test, the external system 100A can calculate values of the above weight coefficients $K_1$, $K_2$, and $K_3$ after collecting the frequencies of a certain amount of oscillating signals SO1, SO2, and S03. For example, after the frequencies of the oscillating signals SO1, SO2, and SO3 corresponding to plural chips 100 are collected, the external system 100A can perform an operation, such as an interpolation or a polynomial regression operation, based on the performance T of the plural chips 100 to estimate the values of the plurality of weight coefficients $K_1$, $K_2$, and $K_3$. In further embodiments, the external system 100A may also perform the above operation by means of machine learning or the like. After finding the plurality of weight coefficients $K_1$, $K_2$, and $K_3$, the external system 100A can subsequently determine the performance of the chip 100 directly based on the performance function described above and the frequencies of the collected oscillating signals SO1, SO2, and S03.

For ease of understanding, the three oscillating signals SO1, SO2, and SO3 are given for illustrative purposes in the above description, but the present disclosure is not limited thereto. As mentioned previously, in some embodiments, the oscillator circuitry 120 may only employ the oscillator circuits 120B and 120C. In some embodiments, the oscillator circuitry 120 may further include the oscillator circuit 120C in order to more accurately determine the performance of the chip 100 based on the voltage variations at locations of the chip 100.

The above setting for each function is given for illustrative purposes, but the present disclosure is not limited thereto. Various functions or operations that can be used to determine the performance of the chip 100 are within the contemplated scope of the present disclosure.

Figure 4:
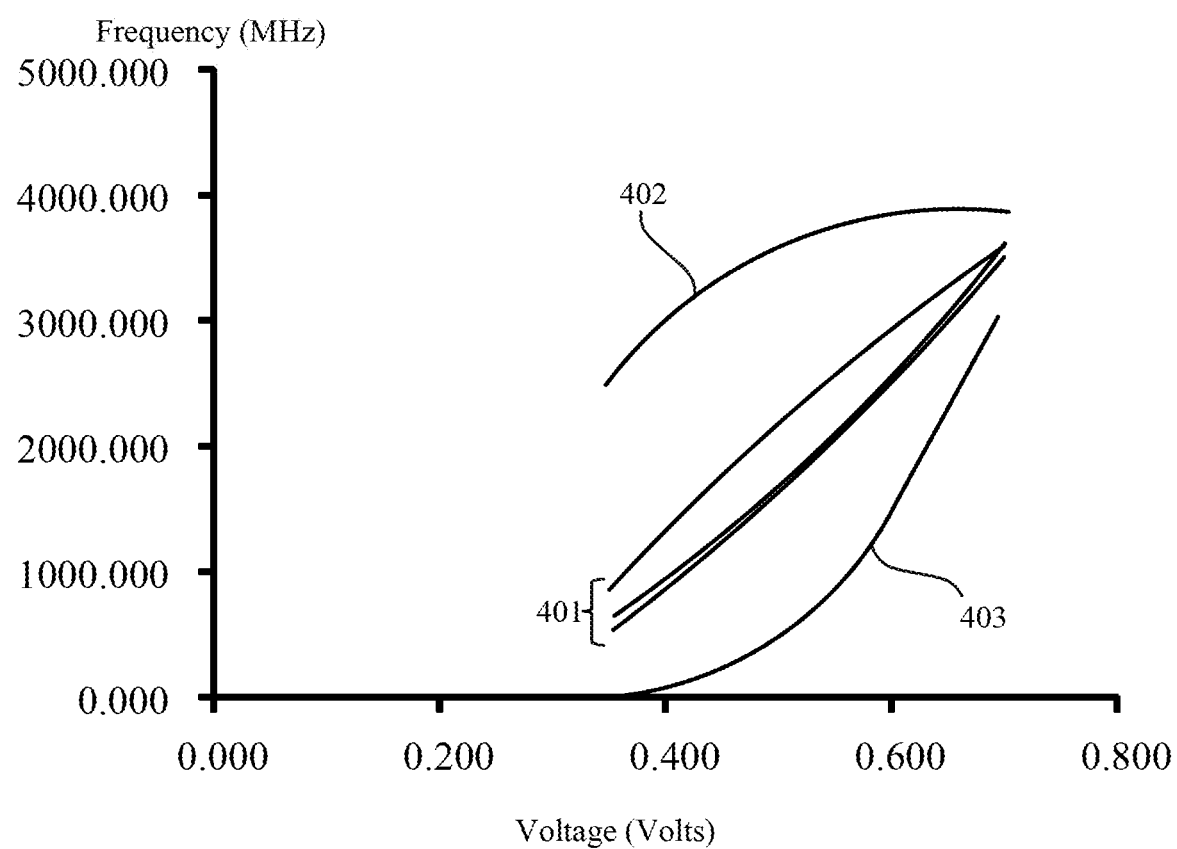
FIG. 4 is a schematic diagram showing relationships between the frequencies of the plurality of oscillating signals in FIG. 2 and the supply voltage according to some embodiments of the present disclosure.

Reference is now made to FIG. 4. FIG. 4 is a schematic diagram showing relationships between the frequencies of the plurality of oscillating signals SO1, SO2 and SO3 in FIG. 2 and the supply voltage VDD according to some embodiments of the present disclosure.

As shown in FIG. 4, a plurality of curves 401 correspond to the simulation results of the oscillating signals SO1, a curve 402 corresponds to the simulation result of the oscillating signal SO2, and a curve 403 corresponds to the simulation result of the oscillating signal SO3. As mentioned previously, the frequency of the oscillating signals SO1 can reflect the device variations, the frequency of the oscillating signals SO2 can reflect the parasitic component variations, and the frequency of the oscillating signal SO3 can be used to reflect the voltage variations. As shown in FIG. 4, when compared with curve 401, both curves 402 and 403 present different changing trends (that is, present different slope changes in the frequency versus voltage relationships). Hence, in some embodiments where the oscillator circuit 120C is additionally used, the external system 100A can further modify the performance of the chip 100 based on the voltage variations to estimate the more accurate real performance.

In some related technologies, only multiple ring oscillators or counters are placed in the chip, and the ring oscillators or counters are used to reflect device variations. With these technologies, as shown in FIG. 4, the variation factors with different changing trends cannot be considered when calculating the performance of the chip. As a result, the determined chip performance is not accurate. As compared with these technologies, in the embodiments of the present disclosure, the real performance of the chip 100 can be determined more accurately by comprehensively considering multiple factors such as device variations, parasitic component variations, and voltage variations, etc.

As described above, the chip and the performance monitoring method according to the present disclosure can determine the performance based on the frequencies of the plurality of oscillating signals generated in the chip. The plurality of oscillating signals are configured to reflect multiple variation factors (device, resistance, voltage, etc.) to more accurately estimate the performance of the chip.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims and their equivalents.

The invention claimed is:

1. A chip comprising:
   at least one oscillator circuitry disposed at different locations of the chip and configured to respectively generate a plurality of oscillating signals; and
   a controller circuitry coupled to the at least one oscillator circuitry, and configured to receive the plurality of oscillating signals and transmit the plurality of oscillating signals to an external system, in order to determine a performance of the chip based on the plurality of oscillating signals;
   wherein each of the at least one oscillator circuitry comprises:
      a first oscillator circuit configured to sense a variation of a semiconductor device in the chip, in order to generate a first oscillating signal of the plurality of oscillating signals;
      a second oscillator circuit configured to sense a variation of a parasitic component in the chip, in order to generate a second oscillating signal of the plurality of oscillating signals; and
      a third oscillator circuit configured to sense a variation of a voltage in the chip, in order to generate a third oscillating signal of the plurality of oscillating signals,
   wherein the at least one oscillator circuitry comprises a first oscillator circuitry, and the first oscillator circuitry is disposed at a predetermined location of the chip;
   wherein the third oscillating signal outputted from the first oscillator circuitry is a reference signal used for evaluating the variation of the voltage.

2. The chip of claim 1, wherein the chip comprises an input/output terminal, the input/output terminal is configured to receive a supply voltage, and the predetermined location is a location adjacent to the input/output terminal in the chip.

3. The chip of claim 1, wherein a frequency of the first oscillating signal, a frequency of the second oscillating signal, and a frequency of the third oscillating signal present different changing trends.

4. The chip of claim 1, wherein a plurality of interconnections of the second oscillator circuit are implemented with different metal layers.

5. A performance monitoring method comprising:

respectively generating, by at least one oscillator circuitry in a chip, a plurality of oscillating signals, wherein the at least one oscillator circuitry is disposed at different locations of the chip; and transmitting the plurality of oscillating signals to an external system, in order to determine a performance of the chip based on the plurality of oscillating signals, wherein each of the at least one oscillator circuitry comprises a first oscillator circuit, a second oscillator circuit and a third oscillator circuit, and generating the plurality of oscillating signals comprises:

sensing, by the first oscillator circuit, a variation of a semiconductor device in the chip, in order to generate a first oscillating signal of the plurality of oscillating signals;

sensing, by the second oscillator circuit, a variation of a parasitic component in the chip, in order to generate a second oscillating signal of the plurality of oscillating signals; and sensing, by the third oscillator circuit, a variation of a voltage in the chip, in order to generate a third oscillating signal of the plurality of oscillating signals, wherein the at least one oscillator circuitry comprises a first oscillator circuitry, and the first oscillator circuitry is disposed at a predetermined location of the chip;

wherein the third oscillating signal outputted from the first oscillator circuitry is a reference signal used for evaluating the variation of the voltage.

6. The performance monitoring method of claim 5, wherein the chip comprises an input/output terminal, the input/output terminal is configured to receive a supply voltage, and the predetermined location is a location adjacent to the input/output terminal in the chip.

7. The performance monitoring method of claim 5, wherein a frequency of the first oscillating signal, a frequency of the second oscillating signal, and a frequency of the third oscillating signal present different changing trends.

8. The performance monitoring method of claim 5, wherein a plurality of interconnections of the second oscillator circuit are implemented with different metal layers.

* * * * *